(12) United States Patent
Ma

(10) Patent No.: US 10,429,237 B2
(45) Date of Patent: Oct. 1, 2019

(54) MSM PHOTOELECTRIC DETECTION DEVICE, METHOD OF DRIVING THE MSM PHOTOELECTRIC DETECTION DEVICE, AND X-RAY DETECTOR

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 15/819,392

(22) Filed: Nov. 21, 2017

(65) Prior Publication Data

US 2018/0202861 A1 Jul. 19, 2018

(30) Foreign Application Priority Data

Jan. 19, 2017 (CN) .......................... 2017 1 0045040

(51) Int. Cl.
  *G01J 1/44* (2006.01)
  *G01T 1/24* (2006.01)
(52) U.S. Cl.
  CPC .................. *G01J 1/44* (2013.01); *G01T 1/24* (2013.01); *G01J 2001/4473* (2013.01)
(58) Field of Classification Search
  CPC ........ G01J 1/44; G01J 2001/4473; G01T 1/24
  USPC ...................................... 250/214.1
  See application file for complete search history.

(56) References Cited

U.S. PATENT DOCUMENTS 6,507,026 B2 * 1/2003 Ikeda ................ H01L 27/14658
                                                250/370.09
8,836,069 B2 * 9/2014 Karim ............. H01L 31/022408
                                                257/448

* cited by examiner

*Primary Examiner* — Seung C Sohn
(74) *Attorney, Agent, or Firm* — Foley & Lardner LLP; James F. Ewing; Paul M. H. Pua

(57) ABSTRACT

This disclosure relates to a Metal-Semiconductor-Metal (MSM) photoelectric detection device, a method of driving the MSM photoelectric detection device, and an X-Ray detector. The device comprises: a plurality of detection units each including: at least one first MSM structure, at least one second MSM structure, a first control unit, a second control unit, a third control unit, a threshold comparison unit, and an energy storage unit, wherein the first control unit is used for controlling the output/reset signal terminal to be connected to or disconnected from the first node; the second control unit is used for controlling the first node to be connected to or disconnected from the second MSM structure; the threshold comparison unit is used for outputting an ON control signal or an OFF control signal; the third control signal is used for connecting or disconnecting the first node to or from the second MSM structure under the control of the control signal outputted by the threshold comparison unit; the energy storage unit is used for storing charges. This disclosure is used for manufacturing the MSM photoelectric detection device.

18 Claims, 5 Drawing Sheets

MSM PHOTOELECTRIC DETECTION DEVICE, METHOD OF DRIVING THE MSM PHOTOELECTRIC DETECTION DEVICE, AND X-RAY DETECTOR

CROSS REFERENCE TO RELATED APPLICATIONS

This application claims the priority right of Chinese Patent Application No. 201710045040.1 as filed on Jan. 19, 2017, the disclosure of which is incorporated herein in its entirety by reference.

Technical Field

This disclosure relates to a Metal-Semiconductor-Metal (MSM) photoelectric detection device, a method of driving the MSM photoelectric detection device, and an X-Ray detector.

Background

UV detection technologies are novel detection technologies which have developed after Infrared detection technologies. The UV detection technologies are widely used in fields such as national defense and military, astronomy, environmental monitoring, combustion engineering, water purification process, flame detection, biological effect, skyline communication, environmental pollution monitoring, etc., and have extremely high military and civil values.

X-Ray detector is a device of converting X-Ray energy into an electric signal for recording. Specifically, the X-Ray detector operates in the following way: an emitter emits X-Rays; the X-Rays pass through an object to be detected and then irradiate on the MSM photoelectric detection device; the MSM photoelectric detection device receives the X-Ray irradiation and generates photon-generated carriers to form a voltage of which a magnitude is proportional to a radiation intensity of the X-Rays received by the MSM photoelectric detection device, thereby to obtain an internal structure of the object to be detected based on the magnitude of the voltage and display the detection of the object to be detected. In addition, when the X-Ray detector does not emit X-Rays at its emitter, the MSM photoelectric detection device will also generate a voltage of which a magnitude is positively related to a light receiving area of the MSM photoelectric detection device. When the X-Ray detector emits X-Rays at its emitter, a voltage converted by the MSM photoelectric detection device is referred to as a photon-generated voltage, and when the X-Ray detector does not emit X-Rays at its emitter, a voltage converted by the MSM photoelectric detection device is referred to as a dark voltage.

SUMMARY

However, when the dark voltage is large and the photon-generated carriers generated by the MSM photoelectric detection device are small, the dark voltage will occupy a large proportion of the output voltage of the MSM photoelectric detection device, thereby to affect a Signal-to-Noise Rate (SNR) of the MSM photoelectric detection device and affect the accuracy of detection results of the X-Ray detector.

An embodiment of this disclosure provides a MSM photoelectric detection device, a method of driving the MSM photoelectric detection device, and an X-Ray detector, for increasing the SNR of the MSM photoelectric detection device.

To reach this object, the embodiment of this disclosure adopts the following technical solution:

in a first aspect, a MSM photoelectric detection device is provided, comprising a plurality of detection units each including: at least one first MSM structure, at least one second MSM structure, a first control unit, a second control unit, a third control unit, a threshold comparison unit, and an energy storage unit;

a first metal layer of the first MSM structure is connected to a first node, and a second metal layer of the first MSM structure is connected to a first level terminal;

a first metal layer of the second MSM structure being connected to the second control unit and the third control unit, and a second metal layer of the second MSM structure being connected to the first level terminal;

the first control unit being connected to an output/reset signal terminal, a first control signal terminal and the first node, for connecting or disconnecting the output/reset signal terminal to or from the first node under the control of the first control signal of the first control signal terminal;

the second control unit being further connected to a second control signal terminal and the first node, for connecting or disconnecting the first node to or from the first metal layer of the second MSM structure under the control of the second control signal of the second control signal terminal;

the threshold comparison unit being connected to the output/reset signal terminal and a third control signal terminal, for outputting an ON control signal from the third control signal terminal if a voltage of the output/reset signal terminal is greater than the threshold voltage, and outputting an OFF control signal from the third control signal terminal if a voltage outputted from the output/reset signal terminal is less than or equal to the threshold voltage;

the third control unit being further connected to the third control signal terminal and the first node, for connecting the first node to the first metal layer of the second MSM structure under the control of the ON control signal outputted from the third control signal terminal, or disconnecting the first node from the first metal layer of the second MSM structure under the control of the OFF control signal outputted from the third control signal terminal; and the energy storage unit being connected to the first node and the first level terminal, for storing charges.

Alternatively, the first control unit comprises a first transistor;

a first terminal of the first transistor is connected to the output/reset signal terminal, a second terminal of the first transistor is connected to the first node, and a gate of the first transistor is connected to the first control signal terminal.

Alternatively, the second control unit comprises a second transistor;

a first terminal of the second transistor is connected to the first node, a second terminal of the second transistor is connected to the first metal layer of the second MSM structure, and a gate of the second transistor is connected to the second control signal terminal.

Alternatively, the third control unit comprises a third transistor;

a first terminal of the third transistor is connected to the first node, a second terminal of the third transistor is connected to the first metal layer of the second MSM structure, and a gate of the third transistor is connected to the third control signal terminal.

Alternatively, the threshold comparison unit comprises a voltage comparator;

a first input terminal of the voltage comparator is connected to the output/reset signal terminal, a second input terminal of the voltage comparator inputs a scan signal, and an output terminal of the voltage comparator is connected to the third control signal terminal.

Alternatively, the energy storage unit comprises a first capacitor;

a first terminal of the first capacitor is connected to the first node, and the second terminal of the first capacitor is connected to the first level terminal.

Alternatively, each of the first, second and third transistors is an N-type transistor, or each of the first, second and third transistors is a P-type transistor.

In a second aspect, a method of driving the MSM photoelectric detection device is provided, for driving the MSM photoelectric detection device according to any one of the first aspect, the method comprising:

a first phase, during which a reset signal is input by the output/reset signal terminal; the first control unit connects the output/reset signal terminal to the first node under the control of the first control signal terminal; the second control unit connects the first node to the first metal layer of the second MSM structure under the control of the second control signal terminal;

a second phase, during which the first control unit disconnects the output/reset signal terminal from the first node under the control of the first control signal terminal; the second control unit connects the first node to the first metal layer of the second MSM structure under the control of the second control signal terminal; the energy storage unit stores charges generated by the first MSM structure and the second MSM structure;

a third phase, during which the first control unit connects the output/reset signal terminal to the first node under the control of the first control signal terminal; the threshold comparison unit compares whether a voltage of the output/reset signal terminal is greater than the threshold voltage; if positive, an ON control signal is outputted from the third control signal terminal, and the third control unit connects the first node to the first metal layer of the second MSM structure under the control of the ON control signal outputted from the third control signal terminal; if negative, an OFF control signal is outputted from the third control signal terminal, and the third control unit disconnects the first node from the first metal layer of the second MSM structure under the control of the OFF control signal outputted from the third control signal terminal;

a fourth phase, during which the first control unit disconnects the output/reset signal terminal from the first node under the control of the first control signal terminal; the second control unit disconnects the first node from the first metal layer of the second MSM structure under the control of the second control signal terminal; if the voltage of the output/reset signal terminal is greater than the threshold voltage during the third phase, the third control unit maintains the connection of the first node to the first metal layer of the second MSM structure, and the energy storage unit stores charges generated by the first MSM structure and the second MSM structure; if the voltage of the output/reset signal terminal is less than or equal to the threshold voltage during the third phase, the third control unit maintains the disconnection of the first node from the first metal layer of the second MSM structure; the energy storage unit stores charges generated by the first MSM structure; and a fifth phase, during which the first control unit connects the output/reset signal terminal to the first node under the control of the first control signal terminal, and the energy storage unit outputs the stored charges at the output/reset signal terminal.

Alternatively, the first control unit comprises: a first transistor, wherein a first terminal of the first transistor is connected to the output/reset signal terminal, a second terminal of the first transistor is connected to the first node, and a gate of the first transistor is connected to the first control signal terminal; the method further comprises:

during the first phase, the first transistor is in an ON state;

during the second phase, the first transistor is in an OFF state;

during the third phase, the first transistor is in an ON state;

during the fourth phase, the first transistor is in an OFF state; and during the fifth phase, the first transistor is in an ON state.

Alternatively, the second control unit comprises: a second transistor, wherein a first terminal of the second transistor is connected to the first node, a second terminal of the second transistor is connected to a first metal layer of the second MSM structure, and a gate of the second transistor is connected to the second control signal terminal; the method further comprises:

during the first phase, the second transistor is in an ON state;

during the second phase, the second transistor is in an ON state;

during the third phase, the second transistor is in an ON state;

during the fourth phase, the second transistor is in an OFF state; and during the fifth phase, the second transistor is in an OFF state.

Alternatively, the third control unit comprises: a third transistor, wherein a first terminal of the third transistor is connected to the first node, a second terminal of the third transistor is connected to a first metal layer of the second MSM structure, and a gate of the third transistor is connected to the third control signal terminal; the method further comprises:

during the third phase, if a voltage of the output/reset signal terminal is greater than the threshold voltage, the third transistor is in an ON state; if a voltage of the output/reset signal terminal is less than or equal to the threshold voltage, the third transistor is in an ON state; and during the fourth phase, if the third transistor is in an ON state during the third phase, the third transistor is in an ON state; if the third transistor is in an OFF state during the third phase, the third transistor is in an OFF state.

Alternatively, the threshold comparison unit comprises: a voltage comparator, wherein a first input terminal of the voltage comparator is connected to the output/reset signal terminal, a scan signal is input by a second input terminal of the voltage comparator, and an output terminal of the voltage comparator is connected to the third control signal terminal;

during the third phase, a voltage of the scan signal is controlled as the threshold voltage; and during the fourth phase, if an ON control signal is outputted from the output terminal of the voltage comparator during the third phase, an ON control signal is outputted from the output terminal of the voltage comparator outputs; if an OFF control signal is outputted from the output terminal of the voltage comparator outputs during the third phase, an OFF control signal is outputted from the output terminal of the voltage comparator.

Alternatively, each of the first, second and third transistors is an N-type transistor, or each of the first, second and third transistors is a P-type transistor.

In a third aspect, an X-Ray detector is provided, comprising the MSM photoelectric detection device according to any one of the first aspect.

An embodiment of this disclosure provides a MSM photoelectric detection device, comprising a plurality of detection units each including: at least one first MSM structure, at least one second MSM structure, a first control unit, a second control unit, a third control unit, a threshold comparison unit and an energy storage unit, wherein, the first control unit is used for connecting or disconnecting an output/reset signal terminal to or from a first node under the control of a first control signal of a first control signal terminal; the second control unit is used for connecting or disconnecting a first node to or from a first metal layer of the second MSM structure under the control of a second control signal of a second control signal terminal; the threshold comparison unit is used for outputting an ON control signal at a third control signal terminal if a voltage of the output/reset signal terminal is greater than the threshold voltage, and outputting an OFF control signal at the third control signal terminal if a voltage of the output/reset signal terminal is less than or equal to the threshold voltage; the third control unit is used for connecting the first node to the first metal layer of the second MSM structure under the control of the ON control signal outputted from the third control signal terminal, or disconnecting the first node from the first metal layer of the second MSM structure under the control of the OFF control signal outputted from the third control signal terminal. The size of a light receiving area of the MSM photoelectric detection device is positively related to the magnitude of the dark voltage. In the embodiment of this disclosure, the light receiving area of a detection unit is divided into two portions, namely of a first MSM structure and a second MSM structure. If a photovoltage generated by the first MSM structure is less than or equal to the threshold voltage, an OFF control signal is outputted from the third control signal terminal, and the third control unit disconnects the first node from the first metal layer of the second MSM structure under the control of the OFF control signal, that is to say, when the photon-generated carriers generated by the MSM structure are small, the adjusted MSM is disconnected from the output/reset signal terminal, and the dark voltage is generated only by the first MSM structure. Since the light receiving area of the detection unit is decreased, the dark voltage generated by the detection unit may be decreased, and thus the proportion of the dark voltage in the voltage outputted from the output/reset signal terminal may be decreased. Therefore, the embodiment of this disclosure can increase the SNR of the MEM photoelectric detection device.

DESCRIPTIONS OF DRAWINGS

To explain the technical solutions in the embodiments of this disclosure or in the prior art more clearly, a simple introduction is made below for the drawings as needed in describing the embodiments or the prior art. Obviously, the drawings as described below are only some embodiments of this disclosure. Based on these drawings, other drawings can be obtained by those skilled in the art without inventive effort.

DETAILED DESCRIPTION

Figure 1:
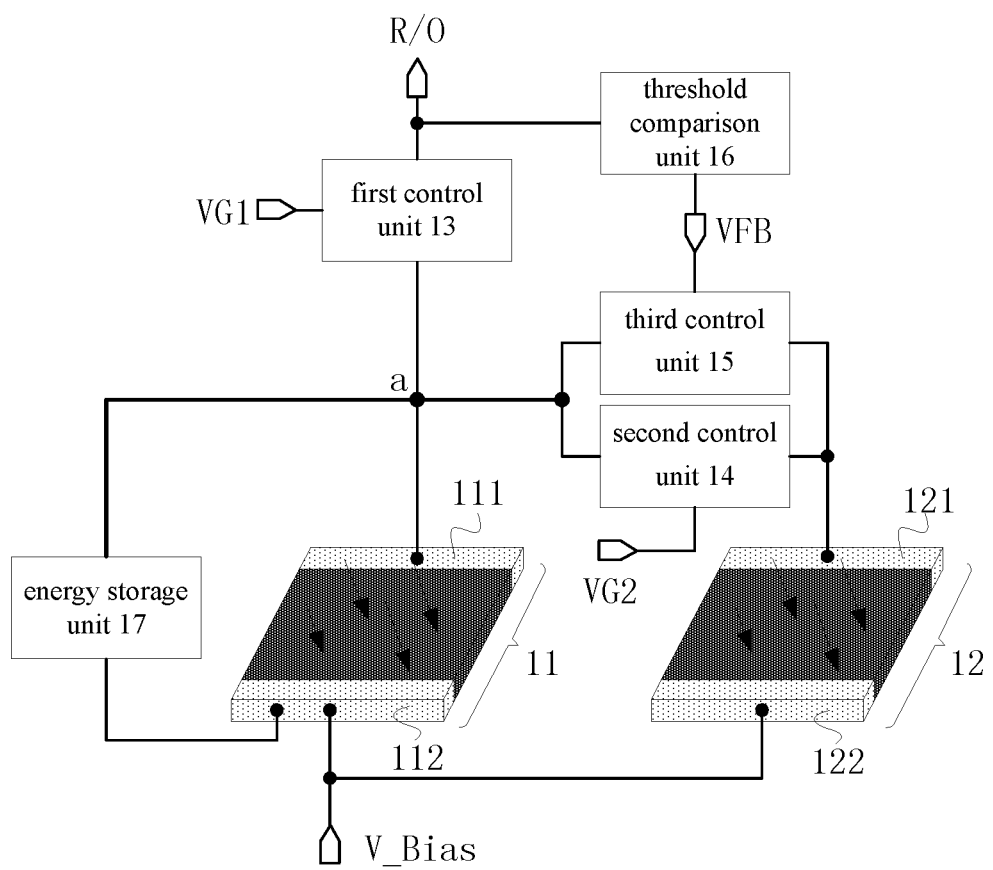
FIG. 1 is one of schematic structure diagrams of the MSM photoelectric detection device as provided by the embodiments of this disclosure.

The technical solutions in the embodiment of this disclosure will be clearly and completely described below in combination with the drawings in the embodiment of this disclosure. Obviously, the described embodiment is only a portion, not all, of embodiments of this disclosure. Based on the embodiments of this disclosure, all the other embodiments obtained by those skilled in the art without inventive effort fall into the protection scope of this disclosure.

Transistors adopted in all the embodiments of this disclosure may be Thin Film Transistors (referred to as TFT for short), Field Effect Transistors, Metal-Oxide-Semiconductor Transistors (referred to as MOS Transistors for short), or other devices having identical characteristics. According to the function in the circuit, the transistors adopted in the embodiments of this disclosure are typically switch transistors. Since the switch transistor adopted herein has a source and a drain which are symmetrical with each other, its source and drain are exchangeable. In the embodiments of this disclosure, to distinguish the other two terminals from the gate in the transistor, the source therein is referred to a first terminal and the drain is referred to a second terminal. According to the state in the drawings, it is specified that in the transistor, the middle terminal is a gate, the signal input terminal is a source, and the signal output terminal is a drain. Furthermore, the switch transistor adopted in the embodiments of this disclosure includes both of P-type switch transistor and N-type switch transistor, wherein the P-type switch transistor is turned ON if the gate is at a low-level and is turned OFF if the gate is at a high-level; the N-type switch transistor is turned ON if the gate is at a high-level and is turned OFF if the gate is at a low-level.

It is further necessary to explain that, to describe the technical solutions of the embodiments of this disclosure more clearly, the embodiments of this disclosure use "first", "second" and the like to distinguish identical items or similar items having substantially identical functions. Those skilled in the art may understand that "first", "second" and the like make no limitation to the number and the execution order.

An embodiment of this disclosure provides a MSM photoelectric detection device. Referring to FIG. 1, the MSM photoelectric detection device comprises a plurality of detection units each including: at least one first MSM structure 11, at least one second MSM structure 12, first control unit 13, second control unit 14, third control unit 15, threshold comparison unit 16 and energy storage unit 17.

It is necessary to explain that, FIG. 1 illustrates an example in which a detection unit includes one first MSM structure 11 and one second MSM structure 12, but the embodiment of this disclosure is not limited hereto. On the basis of the aforementioned embodiments, the number of the first MSM structures 11 and the number of the second MSM structures 12 may be other numbers. For example, a detection unit includes three MSM structure, wherein one is a first MSM structure 11, and the other two are second MSM structures 12. For another example, a detection unit includes four MSM structures, wherein two are first MSM structures 11 and the other two are second MSM structures 12. Furthermore, the embodiment of this disclosure makes no limitation to a size of the light receiving area of the first MSM structure 11 and the second MSM structure 12, and those skilled in the art may set the light receiving area of the first MSM structure 11 and the second MSM structure 12 in an arbitrary proportion as needed.

In the following, by referring to FIG. 1, explanations are given in detail for a MSM structure 11 and a MSM structure 12 in a detection unit of the MEM photoelectric detection device as provided in the aforementioned embodiments, connection relationship of the functional units, and functions of the functional units in the MEM photoelectric detection device.

A first metal layer 111 of a first MSM structure 11 is connected to a first node a, and a second metal layer 112 of the first MSM structure 11 is connected to a first level terminal V_Bias.

A first metal layer 121 of a second MSM structure 12 is connected to a second control unit 14 and a third control unit 15, and a second metal layer 122 of the second MSM structure 12 is connected to the first level terminal V_Bias.

Figure 2:
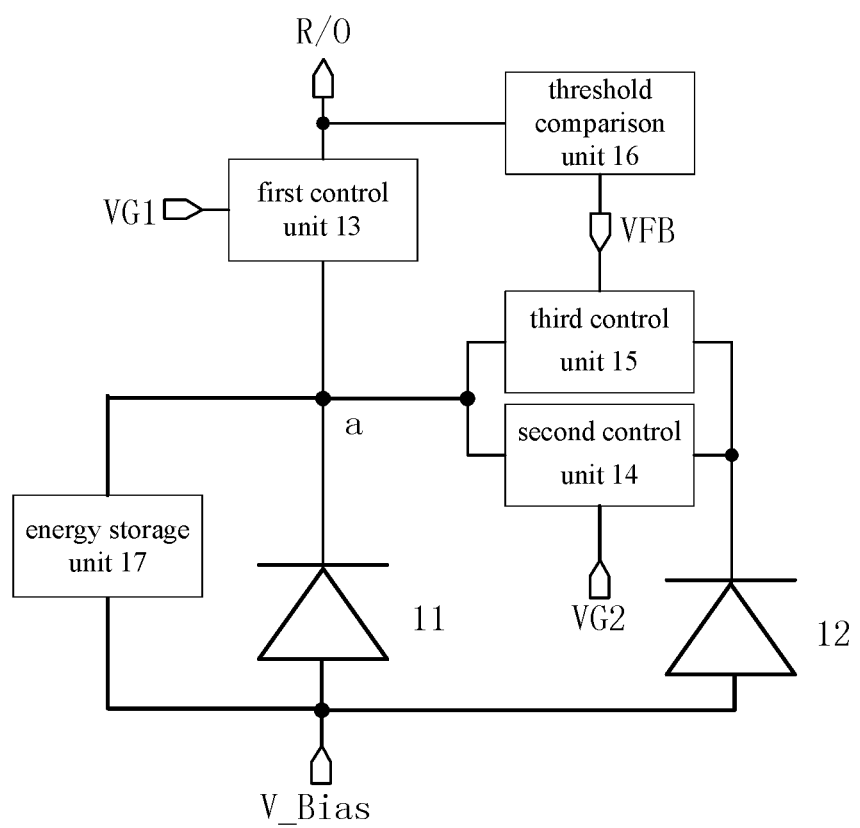
FIG. 2 is one of schematic structure diagrams of the MSM photoelectric detection device as provided by the embodiments of this disclosure.

Since each MSM structure in the MSM photoelectric detection device is equivalent to a diode that can generate photon-generated carriers in terms of function, the MSM photoelectric detection device as shown in FIG. 1 above is further equivalent to the MSM photoelectric detection device as shown in FIG. 2.

The first control unit 13 is connected to an output/reset signal terminal R/O, a first control signal terminal VG1 and the first node a, for connecting or disconnecting the output/reset signal terminal R/O to or from the first node a under the control of the first control signal of the first control signal terminal VG1.

The second control unit 14 is further connected to a second control signal terminal VG2 and the first node a, for connecting or disconnecting the first node a to or from the first metal layer 121 of the second MSM structure 12 under the control of the second control signal of the second control signal terminal VG2.

A threshold comparison unit 16 is connected to the output/reset signal terminal R/O and a third control signal terminal VFB, for outputting an ON control signal at the third control signal terminal VFB if a voltage of the output/reset signal terminal R/O is greater than the threshold voltage, and outputting an OFF control signal at the third control signal terminal VFB if a voltage outputted from the output/reset signal terminal R/O is less than or equal to the threshold voltage.

Note that, the embodiment of this disclosure makes no limitation to the specific magnitude of the threshold voltage, and those skilled in the art can make a setup in accordance with the light receiving area of the first MSM structure 11 and the requirement to the SNR of the output detection signal of the MSM photoelectric detection device. The larger the light receiving area of first MSM structure 11 and the higher the requirement to the SNR of the output detection signal of the MSM photoelectric detection device, the greater the threshold voltage. Furthermore, the threshold voltage may be further set as a dynamically-adjustable value, and during the use of the MSM photoelectric detection device, the magnitude of the threshold voltage may be adjusted according to actual needs, so as to accommodate different usage scenarios.

The third control unit 15 is further connected to the third control signal terminal VFB and the first node a, for connecting the first node a to the first metal layer 121 of the second MSM structure 12 under the control of the ON control signal outputted from the third control signal terminal VFB, or disconnecting the first node a from the first metal layer 121 of the second MSM structure 12 under the control of the OFF control signal outputted from the third control signal terminal VFB.

The energy storage unit 16 is connected to the first node a and the first level terminal V_Bias, for storing charges.

The embodiment of this disclosure provides a MSM photoelectric detection device, comprising a plurality of detection units each including: at least one first MSM structure, at least one second MSM structure, a first control unit, a second control unit, a third control unit, a threshold comparison unit and an energy storage unit, wherein, the first control unit is used for connecting or disconnecting an output/reset signal terminal to or from a first node under the control of a first control signal of a first control signal terminal; the second control unit is used for connecting or disconnecting a first node to or from a first metal layer of the second MSM structure under the control of a second control signal of a second control signal terminal; the threshold comparison unit is used for outputting an ON control signal at a third control signal terminal if a voltage of the output/reset signal terminal is greater than the threshold voltage, and outputting an OFF control signal at the third control signal terminal if a voltage of the output/reset signal terminal is less than or equal to the threshold voltage; the third control unit is used for connecting the first node to the first metal layer of the second MSM structure under the control of the ON control signal outputted from the third control signal terminal, or disconnecting the first node from the first metal layer of the second MSM structure under the control of the OFF control signal outputted from the third control signal terminal. A size of the light receiving area of the MSM photoelectric detection device is positively related to a magnitude of the dark voltage. In the embodiment of this disclosure, the light receiving area of a detection unit is divided into two portions, namely of a first MSM structure and a second MSM structure. If a photovoltage generated by the first MSM structure is less than or equal to the threshold voltage, an OFF control signal is outputted from the third control signal terminal, and the third control unit disconnects the first node from the first metal layer of the second MSM structure under the control of the OFF control signal, that is to say, when photon-generated carriers generated by the MSM structure are small, the adjusted MSM is disconnected from the output/reset signal terminal, and the dark voltage is generated only by the first MSM structure. Since the light receiving area of the detection unit is decreased, the dark voltage generated by the detection unit may be decreased, and thus the proportion of the dark voltage in the voltage outputted from the output/reset signal terminal may be decreased. Therefore, the embodiment of this disclosure can increase the SNR of the MEM photoelectric detection device.

Figure 3:
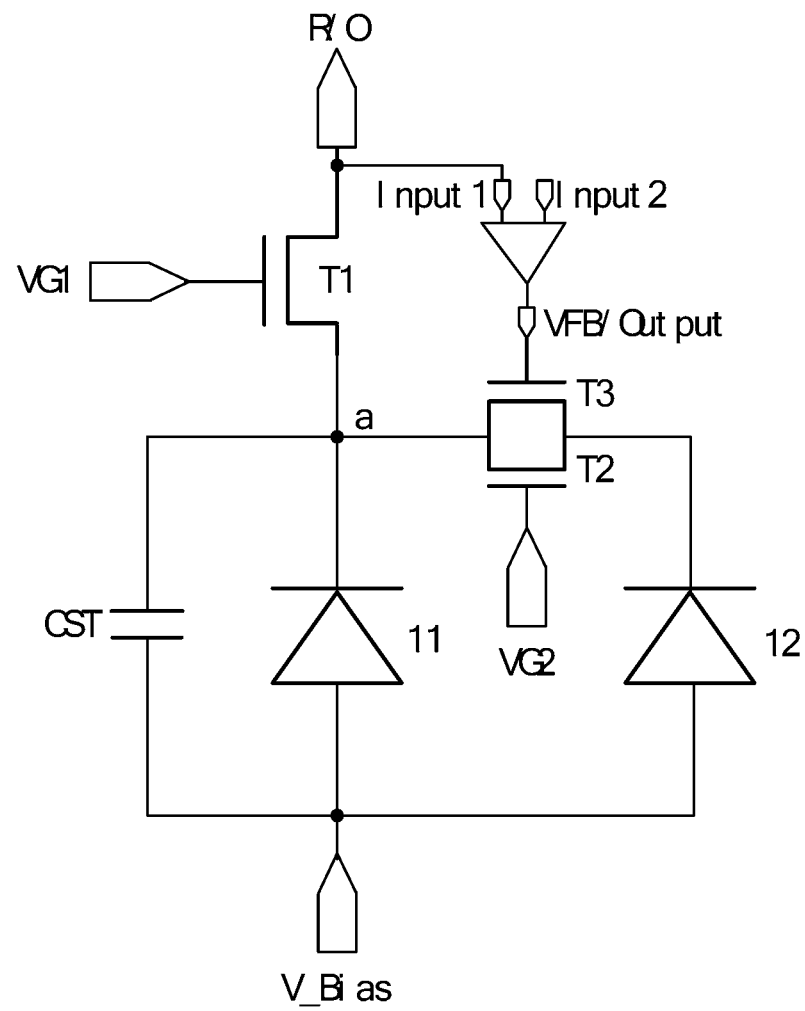
FIG. 3 is a circuit diagram of the MSM photoelectric detection device as provided by the embodiment of this disclosure.

Furthermore, the embodiment of this disclosure provides an exemplary implementation of the aforementioned MSM photoelectric detection device. For example, as shown in FIG. 3, the first control unit 13 includes: a first transistor T1;

a first terminal of the first transistor T1 is connected to an output/reset signal terminal R/O, a second terminal of the first transistor T1 is connected to a first node a, and a gate of the first transistor T1 is connected to a first control signal terminal VG1.

The second control unit 14 includes: a second transistor T2;

a first terminal of the second transistor T2 is connected to the first node a, a second terminal of the second transistor T2 is connected to a first metal layer 121 of the second MSM structure 12, and a gate of second transistor T2 is connected to the second control signal terminal VG2.

The third control unit 15 includes: a third transistor T3;

a first terminal of the third transistor T3 is connected to the first node a, a second terminal of the third transistor T3 is connected to a first metal layer 121 of the second MSM structure 12, and a gate of the third transistor T3 is connected to the third control signal terminal VFB.

Alternatively, the threshold comparison unit 16 includes: a voltage comparator 161;

a first input terminal (Input1) of the voltage comparator 161 is connected the output/reset signal terminal R/O, a scan signal is inputted from a second input terminal (Input2) of the voltage comparator 161, and an output terminal of the voltage comparator 161 is connected to the third control signal terminal VFB.

Certainly, on the basis of the aforementioned embodiment, those skilled in the art can also implement the threshold comparison unit 16 in the aforementioned embodiment using other devices or circuits, which, however, belongs to a reasonable alternative solution of the embodiments of this disclosure and thus falls into the protection scope of this disclosure.

The energy storage unit 16 includes: a first capacitor CST;

a first terminal of the first capacitor CST is connected to the first node a, and a second terminal of the first capacitor CST is connected to the first level terminal V_Bias.

Figure 4:
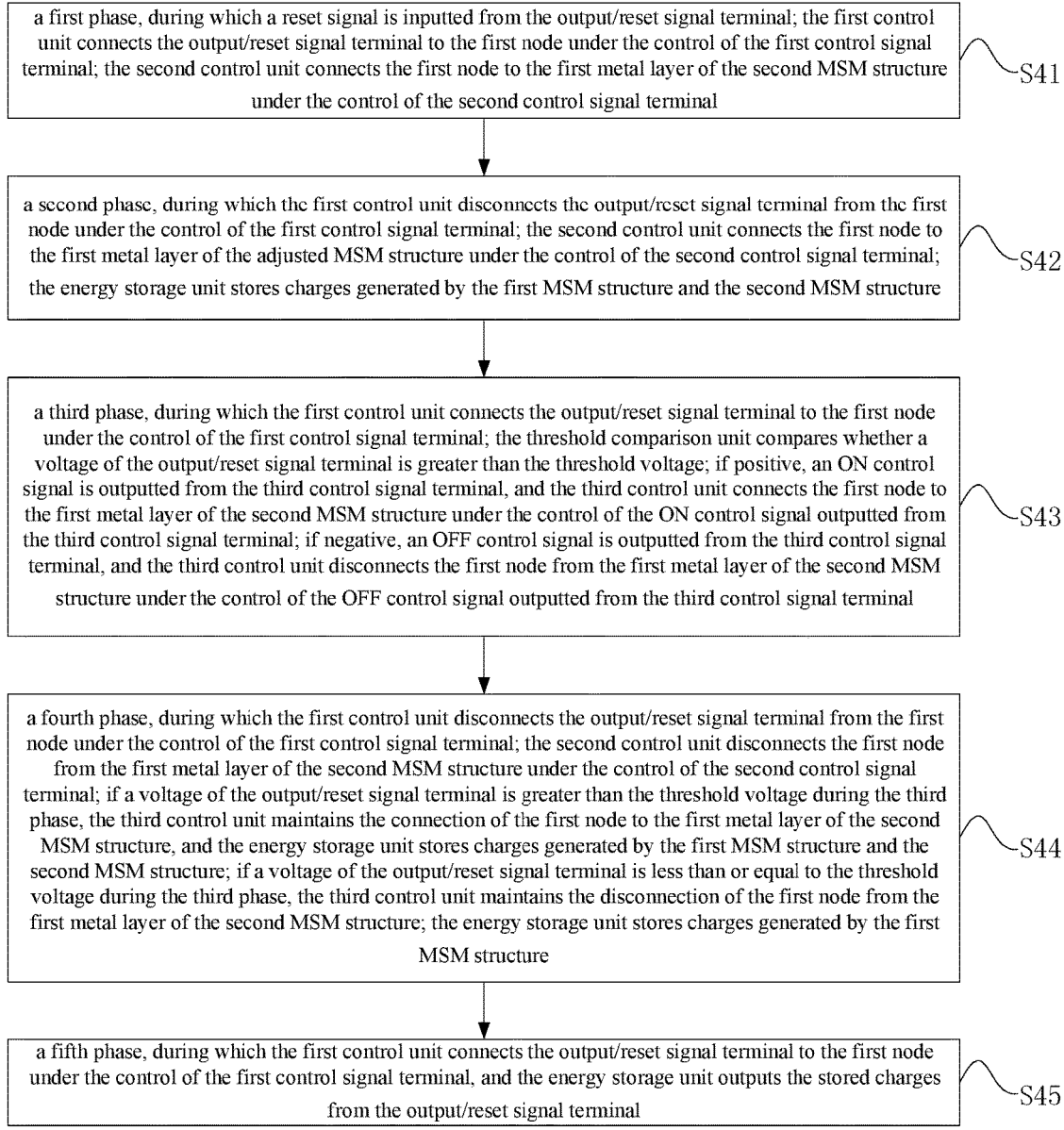
FIG. 4 is a flow diagram of steps of the method of driving the MSM photoelectric detection device as provided by the embodiment of this disclosure.

This disclosure provides, in an embodiment, a method of driving the MSM photoelectric detection device, for driving the MSM photoelectric detection device as provided in any one of the aforementioned embodiments. For example, as shown in FIG. 4, the method comprises steps of:

S41, a first phase, during which a reset signal is inputted from the output/reset signal terminal; the first control unit connects the output/reset signal terminal to the first node under the control of the first control signal terminal; the second control unit connects the first node to the first metal layer of the second MSM structure under the control of the second control signal terminal;

S42, a second phase, during which the first control unit disconnects the output/reset signal terminal from the first node under the control of the first control signal terminal; the second control unit connects the first node to the first metal layer of the second MSM structure under the control of the second control signal terminal; the energy storage unit stores charges generated by the first MSM structure and the second MSM structure;

S43, a third phase, during which the first control unit connects the output/reset signal terminal to the first node under the control of the first control signal terminal; the threshold comparison unit compares whether a voltage of the output/reset signal terminal is greater than the threshold voltage; if positive, an ON control signal is outputted from the third control signal terminal, and the third control unit connects the first node to the first metal layer of the second MSM structure under the control of the ON control signal outputted from the third control signal terminal; if negative, an OFF control signal is outputted from the third control signal terminal, and the third control unit disconnects the first node from the first metal layer of the second MSM structure under the control of the OFF control signal outputted from the third control signal terminal;

S44, a fourth phase, during which the first control unit disconnects the output/reset signal terminal from the first node under the control of the first control signal terminal; the second control unit disconnects the first node from the first metal layer of the second MSM structure under the control of the second control signal terminal; if the voltage of the output/reset signal terminal is greater than the threshold voltage during the third phase, the third control unit maintains the connection of the first node to the first metal layer of the second MSM structure, and the energy storage unit stores charges generated by the first MSM structure and the second MSM structure; if the voltage of the output/reset signal terminal is less than or equal to the threshold voltage during the third phase, the third control unit maintains the disconnection of the first node from the first metal layer of the second MSM structure; the energy storage unit stores charges generated by the first MSM structure; and S45, a fifth phase, during which the first control unit connects the output/reset signal terminal to the first node under the control of the first control signal terminal, and the energy storage unit outputs the stored charges from the output/reset signal terminal.

Alternatively, if the first control unit 13 comprises a first transistor T1, a first terminal of the first transistor T1 is connected to the output/reset signal terminal R/O, a second terminal of the first transistor T1 is connected to the first node a, and a gate of the first transistor T1 is connected to the first control signal terminal VG1; the method further comprises:

during the first phase, the first transistor T1 is in an ON state;

during the second phase, the first transistor T1 is in an OFF state;

during the third phase, the first transistor T1 is in an ON state;

during the fourth phase, the first transistor T1 is in an OFF state; and during the fifth phase, the first transistor T1 is in an ON state.

Alternatively, if the second control 14 comprises a second transistor T2, a first terminal of the second transistor T2 is connected to the first node a, a second terminal of the second transistor T2 is connected to the first metal layer 121 of the second MSM structure 12, and a gate of the second transistor T2 is connected to the second control signal terminal VG2; the method further comprises:

during the first phase, the second transistor T2 is in an ON state;

during the second phase, the second transistor T2 is in an ON state;

during the third phase, the second transistor T2 is in an ON state;

during the fourth phase, the second transistor T2 is in an OFF state; and during the fifth phase, the second transistor T2 is in an OFF state.

Alternatively, if the third control unit 15 comprises a third transistor T3, a first terminal of the third transistor T3 is connected to the first node a, a second terminal of the third transistor T3 is connected to the first metal layer 121 of the second MSM structure 12, and a gate of the third transistor T3 is connected to the third control signal terminal VFB; the method further comprises:

during the third phase, if a voltage of the output/reset signal terminal R/O is greater than the threshold voltage, the third transistor T3 is in an ON state; if a voltage of the output/reset signal terminal R/O is less than or equal to the threshold voltage, the third transistor T3 is in an ON state; and during the fourth phase, if the third transistor T3 is in an ON state during the third phase, the third transistor T3 is in an ON state; if the third transistor T3 is in an OFF state during the third phase, the third transistor T3 is in an OFF state.

Alternatively, the threshold comparison unit 16 comprises: a voltage comparator 161, wherein a first input terminal (Input1) of the voltage comparator 161 is connected to the output/reset signal terminal R/O, a scan signal is inputted from a second input terminal (Input2) of the voltage comparator 161, and an output terminal of the voltage comparator 161 is connected to the third control signal terminal VFB;

during the third phase, a voltage of the scan signal is controlled as the threshold voltage; and during the fourth phase, if an ON control signal is outputted by the output terminal (Output) of the voltage comparator 161 during the third phase, an ON control signal is outputted by the output terminal (Output) of the voltage comparator 161; if an OFF control signal is outputted by the output terminal (Output) of the voltage comparator 161 during the third phase, an OFF control signal is outputted by the output terminal (Output) of the voltage comparator 161.

For example, a signal outputted from the output terminal (Output) of the voltage comparator 161 can be controlled by adjusting a voltage inputted to the second input terminal (Input2) of the voltage comparator 161. For example, when it is necessary to control the output terminal (Output1) of the voltage comparator 161 to output a high-level signal, a voltage of the scan signal may be made to be a voltage that is less than the output/reset signal terminal R/O, e.g., a ground voltage, such that the output terminal (Output) of the voltage comparator 161 can be controlled to output a high-level signal. As another example, when it is necessary to control the output terminal (Output) of the voltage comparator 161 to output a low-level signal, a voltage of the scan signal may be made to be a voltage that is greater than the output/reset signal terminal R/O, such that the output terminal (Output) of the voltage comparator 161 can be controlled to output a low-level signal.

Figure 5:
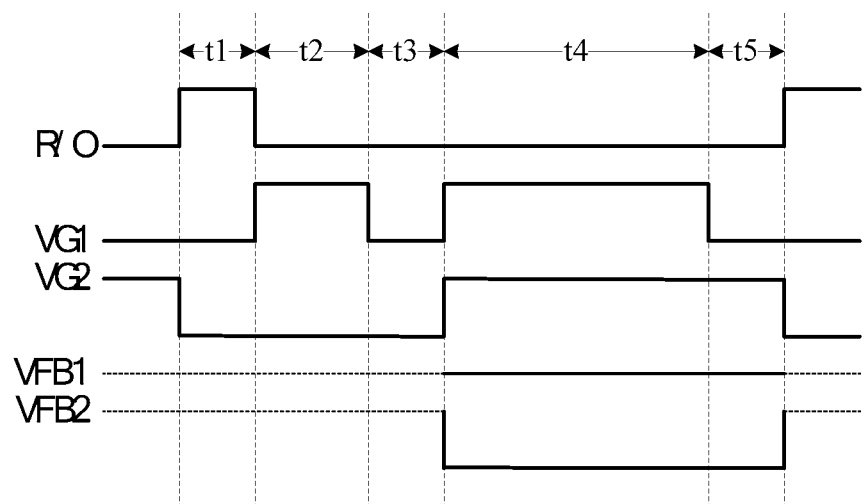
FIG. 5 is a signal timing diagram of the MSM photoelectric detection device as provided by the embodiment of this disclosure.

In the following, taking, for an example, a P-type transistor which is turned ON when a gate of each transistor in the MSM photoelectric detection device as shown in FIG. 3 is at a low-level, an explanation is made for a principle of the MSM photoelectric detection device as shown in FIG. 1, FIG. 2 or FIG. 3 and the method of driving the MSM photoelectric detection device as shown in FIG. 4. The timing state of each signal is shown in FIG. 5. For example, FIG. 5 is a diagram illustrating timing states of a reset signal of the output/reset signal terminal R/O, a first control signal of the first control signal terminal VG1, a second control signal of the second control signal terminal VG2, and a third control signal of the third control signal terminal VFB. The timing state diagram as shown in FIG. 5 includes five phases, respectively of a first phase t1, a second phase t2, a third phase t3, a fourth phase t4, and a fifth phase t5.

During the first phase t1, the first control signal of the first control signal terminal VG1 is at a low-level, and thus the first transistor T1 is turned ON; the second control signal of the second control signal terminal VG2 is at a low-level, and thus the second transistor T2 is turned ON; a reset signal in inputted from the output/reset signal terminal R/O, and the reset signal is written through the first transistor T1, the first node a, and the second transistor T2 into the first metal layer 111 of the first MSM structure 11, the first metal layer 121 of the second MSM structure 12, and the first terminal of the first capacitor CST which is charged.

During the second phase t2, the first control signal of the first control signal terminal VG1 is at a high-level, and thus the first transistor T1 is turned OFF; the second control signal of the second control signal terminal VG2 is at a low-level, and thus the second transistor T2 is turned ON; photon-generated carriers are generated by a semiconductor layer in the first MSM structure 11 and the second MSM structure 12 under illumination, and the first capacitor CST is charged/discharged under the effect of the photon-generated carriers and the first level terminal V_Bias such that a voltage across both terminals of the first capacitor CST is changed.

During the third phase t3, the first control signal of the first control signal terminal VG1 is at a low-level, and thus the first transistor is turned ON; the second control signal of the second control signal terminal VG2 is at a low-level, and thus the second transistor T2 is turned ON; since the first transistor T1 is turned ON, the threshold detection unit 16 may detect whether a voltage stored in the first capacitor CST is greater than a first threshold. In such circumstance, the voltage stored in the first capacitor CST is related to a sum of the photon-generated carriers generated by the semiconductor layer in the first MSM structure 11 and the second MSM structure 12 under illumination. If the voltage stored in the first capacitor CST is greater than the threshold voltage, it indicates that the photon-generated carriers generated by the semiconductor layer in the first MSM structure 11 and the second MSM structure 12 under illumination are large, the dark voltage occupies a small proportion, and the SNR is less affected. Accordingly, the connection of the first metal layer 111 of the MSM structure 11 to the first metal layer 121 of the second MSM structure 12 can be maintained, the threshold detection unit 16 outputs a low-level signal (FVB1 as shown in FIG. 5) at the third control signal terminal VFB, and the third transistor is turned ON. If the voltage stored in the first capacitor CST is less than or equal to the threshold voltage, it indicates that the photon-generated carriers generated by the semiconductor layer in the first MSM structure 11 and the second MSM structure 12 under illumination are small, the dark voltage occupies a large proportion, and the SNR is largely affected. Accordingly, it is necessary to disconnect the first metal layer 111 of the MSM structure 11 from the first metal layer 121 of the second MSM structure 12, the threshold detection unit 16 outputs a high-level signal (FVB2 as shown in FIG. 5) at the third control signal terminal VFB, and the third transistor is turned OFF.

During the fourth phase t4, the first control signal of the first control signal terminal VG1 is at a high-level, and thus the first transistor T2 is turned OFF; the second control signal of the second control signal terminal VG2 is at a high-level, and thus the second transistor T2 is turned OFF; the third control signal of the third control signal terminal VFB remains the same as that during third phase t3. If the threshold detection unit 16 outputs a low-level signal at the third control signal terminal VFB during the third phase t3 and the third transistor T3 is turned ON, the threshold detection unit 16 still outputs a low-level signal at the third control signal terminal VFB during the fourth phase t4, the third transistor T3 remains ON. Photon-generated carriers are generated by the semiconductor layer in the first MSM structure 11 and the second SMS structure 12 under illumination, and the first capacitor CST is charged/discharged under the effect of the photon-generated carriers and the first level terminal V_Bias, such that a voltage across both terminals of the first capacitor CST is changed. If the threshold detection unit 16 outputs a high-level signal at the third control signal terminal VFB during the third phase t3 and the third transistor T3 is turned OFF, the threshold detection unit 16 still outputs a high-level signal at the third control signal terminal VFB during the fourth phase t4, the third transistor T3 remains OFF. Photon-generated carriers are generated by the semiconductor layer in the first MSM structure 11 and the second SMS structure 12 under illumination. Since both of the second transistor T2 and the third transistor T3 are turned OFF, the photon-generated carriers generated by the second MSM structure 12 cannot flow into the first capacitor CST, and the first capacitor CST is charged/discharged only under the effect of the photon-generated carriers generated by the first MSM structure 11 and the first level terminal V_Bias, such that a voltage across both terminals of the first capacitor CST is changed.

During the fifth phase t5, a first control signal of the first control signal terminal VG1 is at a low-level, and thus the first transistor T1 is turned ON; a second control signal of the second control signal terminal VG2 is at a high-level, and thus the second transistor T2 is turned OFF; since the first transistor T1 is turned ON, charges stored in the first capacitor CST can be read out and the charges read out during this phase serve as an ultimate detection signal.

It is necessary to explain that, during the first phase t1 and the second phase t2, the second transistor T2 is turned ON. Regardless of ON or OFF of the third transistor T3, the first node a is connected to the first metal layer 121 of the second MSM structure 12, and thus a state of the third transistor T3 is not defined during the first phase t1 and the second phase t2, that is to say, the third transistor T3 may be in an ON state or an OFF state during the first phase t1 and the second phase t2. During the fifth phase t5, the second transistor T2 is turned OFF, and a voltage stored in the first capacitor CST will be read out during this phase. If the third transistor T3 is turned ON during the fourth phase, ON or OFF of the third transistor T3 will not affect the voltage stored in CST during the fifth phase, and thus the third transistor T3 may be in an ON state or in an OFF state. If the third transistor T3 is turned OFF during the fourth phase, the third transistor T3 may continue to be OFF during the fifth phase, otherwise the photon-generated carriers generated by the second MSM structure 12 will also affect the voltage stored in CST during the fifth phase t5, and thus will affect the accuracy of the ultimate detection signal. Therefore, the state of the third transistor T3 needs to still remain the same as that during the third phase t3 and the fourth phase t4.

Furthermore, each transistor in the MSM photoelectric detection device in the aforementioned embodiments may be a N-type transistor which is turned ON when the gate is at a high-level. If each transistor is an N-type transistor, it is only necessary to readjust the timing state of each input signal in the MSM photoelectric detection device. For example, in FIG. 5, the first control signal of the first control signal terminal VG1 during the first phase t1 is adjusted to be a high-level, the second control signal of the second control signal terminal VG2 during the first phase t1 is adjusted to be a high-level, and signals during the other signal phases are also adjusted to be timing signals having an opposite phase.

Furthermore, the aforementioned MSM photoelectric detection device can also adopt the N-type transistor and the P-type transistor at the same time. At this time, it is necessary to guarantee that the transistors controlled by the same timing signal or voltage in the MSM photoelectric detection device need to be of the same type, which is certainly a reasonable alternative solution that can be made by those skilled in the art according to the embodiments of this disclosure and thus shall fall into the protection scope of this disclosure. However, considering the manufacturing process of transistors, active layers of different types of transistors are doped with different materials, so the use of the uniform type of transistors in the MSM photoelectric detection device will better facilitate the simplification of the manufacturing process of the MSM photoelectric detection device.

An embodiment of this disclosure provides an X-Ray detector, comprising any one of the MSM photoelectric detection devices as provided in the aforementioned embodiments.

In the embodiment of this disclosure, a light receiving area of a detection unit of the MSM photoelectric detection device of the X-Ray detector is divided into two portions, namely of a first MSM structure and a second MSM structure. If a voltage generated by the first MSM structure is less than or equal to the threshold voltage, an OFF control signal is outputted from the third control signal terminal, and the third control unit disconnects the first node form the first metal layer of the second MSM structure under the control of the OFF control signal. That is to say, if photon-generated carriers generated by the MSM structure are small, the adjusted MSM is disconnected from the output/reset signal terminal, and a dark voltage is generated only by the first MSM structure. Since the light receiving area of the detection unit is decreased, the dark voltage generated by the detection unit may be decreased, and thus a proportion of the dark voltage in the voltage outputted from the output/reset signal terminal may be decreased. Therefore, the embodiment of this disclosure can increase the SNR of the MSM photoelectric detection device, and thus can improve the accuracy of the detection result of the X-Ray detector.

All the above are only particular embodiments of this disclosure, but the protection scope of this disclosure is not limited hereto. Any variation or replacement that can be readily conceived by those skilled in the art within the technical range as disclosed in this disclosure shall be included in the protection scope of this disclosure. Therefore, the protection scope of this disclosure shall be in line with the protection scope of the claims.

What is claimed is:

1. A Metal-Semiconductor-Metal (MSM) photoelectric detection device, comprising a plurality of detection units each including: at least one first MSM structure, at least one second MSM structure, a first control unit, a second control unit, a third control unit, a threshold comparison unit, and an energy storage unit;
   a first metal layer of the first MSM structure being connected to a first node, a second metal layer of the first MSM structure being connected to a first level terminal;
   a first metal layer of the second MSM structure being connected to the second control unit and the third control unit, a second metal layer of the second MSM structure being connected to the first level terminal;
   the first control unit being connected to an output/reset signal terminal, a first control signal terminal and the first node, for connecting or disconnecting the output/ reset signal terminal to or from the first node under the control of a first control signal of the first control signal terminal;

the second control unit being further connected to a second control signal terminal and the first node, for connecting or disconnecting the first node to or from the first metal layer of the second MSM structure under the control of a second control signal of the second control signal terminal;

the threshold comparison unit being connected to the output/reset signal terminal and a third control signal terminal, for outputting an ON control signal from the third control signal terminal if a voltage of the output/reset signal terminal is greater than a threshold voltage, and outputting an OFF control signal from the third control signal terminal if the voltage of the output/reset signal terminal is less than or equal to the threshold voltage;

the third control unit being further connected to the third control signal terminal and the first node, for connecting the first node to the first metal layer of the second MSM structure under the control of the ON control signal outputted from the third control signal terminal, or disconnecting the first node from the first metal layer of the second MSM structure under the control of the OFF control signal outputted from the third control signal terminal; and the energy storage unit being connected to the first node and the first level terminal, for storing charges.

2. The MSM photoelectric detection device according to claim 1, wherein the first control unit comprises a first transistor;

a first terminal of the first transistor is connected to the output/reset signal terminal, a second terminal of the first transistor is connected to the first node, and a gate of the first transistor is connected to the first control signal terminal.

3. The MSM photoelectric detection device according to claim 1, wherein the second control unit comprises a second transistor;

a first terminal of the second transistor is connected to the first node, a second terminal of the second transistor is connected to the first metal layer of the second MSM structure, and a gate of the second transistor is connected to the second control signal terminal.

4. The MSM photoelectric detection device according to claim 1, wherein the third control unit comprises a third transistor;

a first terminal of the third transistor is connected to the first node, a second terminal of the third transistor is connected to the first metal layer of the second MSM structure, and a gate of the third transistor is connected to the third control signal terminal.

5. The MSM photoelectric detection device according to claim 1, wherein the threshold comparison unit comprises a voltage comparator;

a first input terminal of the voltage comparator is connected to the output/reset signal terminal, a scan signal is inputted from a second input terminal of the voltage comparator, and an output of the voltage comparator is connected to the third control signal terminal.

6. The MSM photoelectric detection device according to claim 1, wherein the energy storage unit comprises a first capacitor;

a first terminal of the first capacitor is connected to the first node, and a second terminal of the first capacitor is connected to the first level terminal.

7. The MSM photoelectric detection device according to claim 2, wherein each said first transistor is an N-type transistor or a P-type transistor.

8. The MSM photoelectric detection device according to claim 3, wherein, each said second transistor is an N-type transistor or a P-type transistor.

9. The MSM photoelectric detection device according to claim 4, wherein each said third transistor is an N-type transistor or a P-type transistor.

10. A method of driving the MSM photoelectric detection device according to claim 1, the method comprising:

a first phase, during which a reset signal is inputted from the output/reset signal terminal; the first control unit connects the output/reset signal terminal to the first node under the control of the first control signal terminal; the second control unit connects the first node to the first metal layer of the second MSM structure under the control of the second control signal terminal;

a second phase, during which the first control unit disconnects the output/reset signal terminal from the first node under the control of the first control signal terminal; the second control unit connects the first node to the first metal layer of the second MSM structure under the control of the second control signal terminal; the energy storage unit stores charges generated by the first MSM structure and the second MSM structure;

a third phase, during which the first control unit connects the output/reset signal terminal to the first node under the control of the first control signal terminal; the threshold comparison unit compares whether a voltage of the output/reset signal terminal is greater than the threshold voltage; if positive, an ON control signal is outputted from the third control signal terminal, and the third control unit connects the first node to the first metal layer of the second MSM structure under the control of the ON control signal outputted from the third control signal terminal; if negative, an OFF control signal is outputted from the third control signal terminal, and the third control unit disconnects the first node from the first metal layer of the second MSM structure under the control of the OFF control signal outputted from the third control signal terminal;

a fourth phase, during which the first control unit disconnects the output/reset signal terminal from the first node under the control of the first control signal terminal; the second control unit disconnects the first node from the first metal layer of the second MSM structure under the control of the second control signal terminal; if the voltage of the output/reset signal terminal is greater than the threshold voltage during the third phase, the third control unit maintains connection of the first node to the first metal layer of the second MSM structure, and the energy storage unit stores charges generated by the first MSM structure and the second MSM structure; if the voltage of the output/reset signal terminal is less than or equal to the threshold voltage during the third phase, the third control unit maintains disconnection of the first node from the first metal layer of the second MSM structure; the energy storage unit stores charges generated by the first MSM structure; and a fifth phase, during which the first control unit connects the output/reset signal terminal to the first node under the control of the first control signal terminal, and the energy storage unit outputs the stored charges from the output/reset signal terminal.

11. The method according to claim 10, wherein the first control unit comprises a first transistor; a first terminal of the first transistor is connected to the output/reset signal terminal, a second terminal of the first transistor is connected to the first node, and a gate of the first transistor is connected to the first control signal terminal; the method further comprises:

during the first phase, the first transistor is in an ON state;
during the second phase, the first transistor is in an OFF state;
during the third phase, the first transistor is in an ON state;
during the fourth phase, the first transistor is in an OFF state; and
during the fifth phase, the first transistor is in an ON state.

12. The method according to claim 10, wherein the second control unit comprises a second transistor; a first terminal of the second transistor is connected to the first node, a second terminal of the second transistor is connected to a first metal layer of the second MSM structure, and a gate of the second transistor is connected to the second control signal terminal; the method further comprises:

during the first phase, the second transistor is in an ON state;
during the second phase, the second transistor is in an ON state;
during the third phase, the second transistor is in an ON state;
during the fourth phase, the second transistor is in an OFF state; and
during the fifth phase, the second transistor is in an OFF state.

13. The method according to claim 10, wherein the third control unit comprises a third transistor; a first terminal of the third transistor is connected to the first node, a second terminal of the third transistor is connected to a first metal layer of the second MSM structure, and a gate of the third transistor is connected to the third control signal terminal; the method further comprises:

during the third phase, if a voltage of the output/reset signal terminal is greater than the threshold voltage, the third transistor is in an ON state; if a voltage of the output/reset signal terminal is less than or equal to the threshold voltage, the third transistor is in an ON state; and
during the fourth phase, if the third transistor is in an ON state during the third phase, the third transistor is in an ON state; if the third transistor is in an OFF state during the third phase, the third transistor is in an OFF state.

14. The method according to claim 13, wherein the threshold comparison unit comprises a voltage comparator; a first input terminal of the voltage comparator is connected to the output/reset signal terminal, a scan signal is inputted from a second input terminal of the voltage comparator, and an output terminal of the voltage comparator is connected to the third control signal terminal;

during the third phase, a voltage of the scan signal is controlled as the threshold voltage; and
during the fourth phase, if an ON control signal is outputted from the output terminal of the voltage comparator during the third phase, an ON control signal is outputted from the output terminal of the voltage comparator; if an OFF control signal is outputted from the output terminal of the voltage comparator during the third phase, an OFF control signal is outputted from the output terminal of the voltage comparator.

15. The method according to claim 11, wherein each said first transistor is an N-type transistor or a P-type transistor.

16. The method according to claim 12, wherein each said second transistor is an N-type transistor or a P-type transistor.

17. The method according to claim 13, wherein each said third transistor is an N-type transistor or a P-type transistor.

18. An X-Ray detector, comprising the MSM photoelectric detection device according to claim 1.

* * * * *